(12) United States Patent
Shin et al.

(10) Patent No.: US 11,757,462 B2
(45) Date of Patent: Sep. 12, 2023

(54) ANALOG-TO-DIGITAL CONVERSION CIRCUIT AND RECEIVER INCLUDING SAME

(71) Applicant: SAMSUNG ELECTRONICS CO., LTD., Suwon-si (KR)

(72) Inventors: Hyochul Shin, Seoul (KR); Seungyeob Baek, Yongin-si (KR); Sungno Lee, Hwaseong-si (KR); Heechang Hwang, Seoul (KR); Michael Choi, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/675,342

(22) Filed: Feb. 18, 2022

(65) Prior Publication Data

US 2022/0337260 A1 Oct. 20, 2022

(30) Foreign Application Priority Data

Apr. 14, 2021 (KR) .................. 10-2021-0048674

(51) Int. Cl.
| | |
|---|---|
| *H03M 1/10* | (2006.01) |
| *H03L 7/081* | (2006.01) |
| *H04B 1/16* | (2006.01) |
| *H04L 25/03* | (2006.01) |
| *H04L 1/00* | (2006.01) |

(52) U.S. Cl.
CPC ........ *H03M 1/1014* (2013.01); *H03L 7/0812* (2013.01); *H04B 1/16* (2013.01); *H04L 1/0071* (2013.01); *H04L 25/03012* (2013.01)

(58) Field of Classification Search
CPC ...... H03M 1/1014; H03L 7/0812; H04B 1/16; H04L 1/0071; H04L 25/03012
See application file for complete search history.

(56) References Cited

U.S. PATENT DOCUMENTS

| | | | |
|---|---|---|---|
| 6,704,890 | B1 | 3/2004 | Carotti et al. |
| 7,245,638 | B2 * | 7/2007 | Agazzi ............. H04L 25/03006 375/327 |
| 7,250,885 | B1 | 7/2007 | Nairn |

(Continued)

FOREIGN PATENT DOCUMENTS

KR 1020200082099 7/2020

OTHER PUBLICATIONS

Behzad Razavi, Design Considerations for Interleaved ADCS, IEEE Journal of Solid-State Circuits, May 13, 2013, vol. 48, ISSUE: 8.

*Primary Examiner* — Dac V Ha
(74) *Attorney, Agent, or Firm* — Fish & Richardson P.C.

(57) ABSTRACT

An analog-to-digital conversion circuit includes; a first analog-to-digital converter (ADC), a second ADC and a third ADC collectively configured to perform conversion operations according to a time-interleaving technique, and a timing calibration circuit configured to calculate correlation values and determine differences between the correlation values using first samples generated by the first ADC, second samples generated by the second ADC, and third samples generated by the third ADC during sampling periods, wherein the timing calibration circuit is further configured to control a phase of a clock signal applied to the second ADC in response to a change in absolute value related to the differences generated during the sampling periods.

18 Claims, 11 Drawing Sheets

(56) References Cited

U.S. PATENT DOCUMENTS

| | | | |
|---|---|---|---|
| 7,894,728 B1* | 2/2011 | Sun | H04L 7/0004 |
| | | | 398/208 |
| 8,307,248 B2 | 11/2012 | Johansson et al. | |
| 8,604,954 B2 | 12/2013 | Chen et al. | |
| 8,836,551 B2 | 9/2014 | Nozaki | |
| 8,890,741 B2 | 11/2014 | Dosho et al. | |
| 9,154,147 B2 | 10/2015 | Biallais et al. | |
| 9,608,652 B2 | 3/2017 | Lee et al. | |
| 9,685,970 B1 | 6/2017 | Lee et al. | |
| 9,866,228 B2 | 1/2018 | Zortea et al. | |
| 10,291,247 B1 | 5/2019 | Verbruggen et al. | |
| 10,312,927 B1* | 6/2019 | Mirhaj | H03M 1/1033 |
| 10,483,996 B1 | 11/2019 | Erdmann et al. | |
| 10,536,155 B1 | 1/2020 | Otte | |
| 10,784,882 B2 | 9/2020 | Kang et al. | |
| 11,190,331 B1* | 11/2021 | Reiss | H04L 7/0025 |
| 2005/0242860 A1* | 11/2005 | Yun | H04N 21/4532 |
| | | | 327/210 |
| 2006/0061501 A1* | 3/2006 | Sheng | H04N 21/4263 |
| | | | 341/155 |
| 2007/0069937 A1* | 3/2007 | Balakrishnan | H03M 1/0624 |
| | | | 341/161 |
| 2010/0253557 A1* | 10/2010 | Kidambi | H03M 1/06 |
| | | | 341/118 |

* cited by examiner

ANALOG-TO-DIGITAL CONVERSION CIRCUIT AND RECEIVER INCLUDING SAME

CROSS-REFERENCE TO RELATED APPLICATION

This U.S. nonprovisional application claims priority under 35 U.S.C. § 119 to Korean Patent Application No. 10-2021-0048674 filed on Apr. 14, 2021 in the Korean Intellectual Property Office, the subject matter of which is hereby incorporated by reference in its entirety.

BACKGROUND

Some embodiments of the inventive concept relate generally to analog-to-digital conversion circuits capable of converting analog signal(s) into corresponding digital signal(s) using a time-interleaving technique. Other embodiments of the inventive concept relate to receivers including same.

Certain analog-to-digital conversion circuits include one or more analog-to-digital converters (ADCs) and control the ADCs according to a time-interleaving technique. Such ADCs are capable of performing high speed analog-to-digital conversion operation(s). However, data distortion may occur due to time skewing error(s) between the respective ADCs. When such distortion arises the overall performance of an analog-to-digital conversion circuit may deteriorate.

Heretofore, a time skew error has been corrected using an auto-correlation operation performed in relation to each of the respective ADCs. However, this approach has proved unsuitable for some higher frequency signals.

SUMMARY

Embodiments, of inventive concept provide analog-to-digital conversion circuits exhibiting improved analog-to-digital conversion efficiency by effectively correcting a time skew error when it arises with respect to a high frequency signal during a high-speed, analog-to-digital conversion operations. Other embodiments of the inventive concept provide receivers including such analog-to-digital conversion circuits.

According to an aspect of the inventive concept, there is provided an analog-to-digital conversion circuit including; a first analog-to-digital converter (ADC), a second ADC and a third ADC collectively configured to perform conversion operations according to a time-interleaving technique, and a timing calibration circuit configured to calculate correlation values and determine differences between the correlation values using first samples generated by the first ADC, second samples generated by the second ADC, and third samples generated by the third ADC during sampling periods, wherein the timing calibration circuit is further configured to control a phase of a clock signal applied to the second ADC in response to a change in absolute value related to the differences generated during the sampling periods.

According to another aspect of the inventive concept, there is provided a receiver including; an analog-to-digital conversion circuit configured to receive an analog signal and convert the analog signal to a digital signal, and an output circuit configured to improve quality of the digital signal. The analog-to-digital conversion circuit includes; analog-to-digital converters (ADCs) collectively configured to perform conversion operations according to a time-interleaving technique, and a timing calibration circuit configured to calculate correlation values and determine differences between the correlation values using samples generated by a target ADC among the ADCs and correlation values using samples generated by an adjacent ADC among the ADCs, wherein the timing calibration circuit is further configured to control a phase of a clock signal applied to the target ADC in response to a change in absolute value related to the differences generated during the sampling periods.

According to still another aspect of the inventive concept, there is provided a timing calibration circuit calibrating respective timings for a first analog-to-digital converters (ADC), a second ADC and a third ADC using a time-interleaving technique. The timing calibration circuit includes; an operation circuit configured to calculate correlation values and differences between the correlation values using first samples generated by the first ADC, second samples generated by the second ADC, and third samples generated by the third ADC during sampling periods, a determination circuit configured to determine a phase shift direction for a clock signal applied to the second ADC in response to a change in absolute value related to the differences and change a value of a delay control signal in response to the phase shift direction to generate a changed delay control signal, and a delay circuit configured to delay the clock signal in response to the changed delay control signal.

BRIEF DESCRIPTION OF THE DRAWINGS

The making and use of the inventive concept, as well as benefit(s) and features(s) of the inventive concept may be better understood upon consideration of the following detailed description together with the accompanying drawings in which.

DETAILED DESCRIPTION

Throughout the written description and drawings, like reference numbers and labels denote like or similar elements, components, features and/or method steps.

Figure 1:
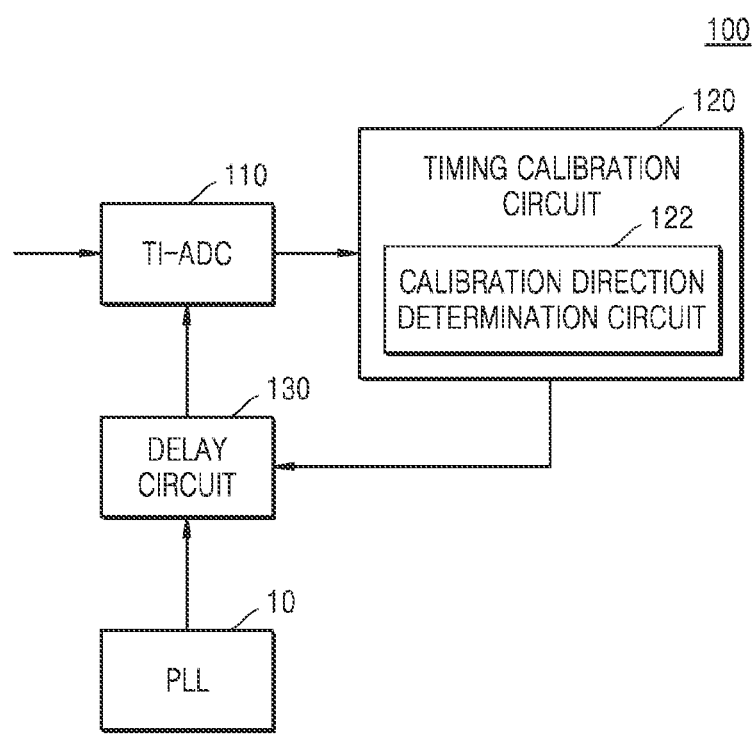
FIG. 1 is a block diagram illustrating an analog-to-digital conversion circuit according to embodiments of the inventive concept.

Figure (FIG. 1 is a block diagram illustrating an analog-to-digital conversion circuit 100 according to embodiments of the inventive concept.

Referring to FIG. 1, the analog-to-digital conversion circuit 100 may include analog-to-digital converters (hereinafter, "ADCs") 110, a timing calibration circuit 120, and a delay circuit 130. In some embodiments, the analog-to-digital conversion circuit 100 may further include a phase locked loop (PLL) circuit 10 generating a reference clock signal.

Here, the ADCs 110 may be controlled using to a time-interleaving (Ti) control technique (or approach). That is a number of ADCs 110 may be included in a time-interleaved ADC, wherein respective ADCs 110 are referred to as "sub-ADCs." In this regard, each ADC 110 may sample an externally-provided input signal in response to clock signals having different phases in order to generate corresponding samples (hereafter, "samples"). In some embodiments, each sample may understood as a digital data value.

The timing calibration circuit 120 of FIG. 1 may be used to calibrate a timing skew between respective ADCs 110 in response to samples derived over a number of sampling periods. Hereinafter, the term "sampling period" refers to a period during which respective ADCs 110s are selected (e.g., one or more times) in order to generate a predetermined number of samples. For example, the timing calibration circuit 120 may calculate correlation values between samples from a target ADC (e.g., an ADC 110 selected from among the ADCs 110 during sampling periods) in relation to samples provided by one or more adjacent ADCs from among the ADCs 110 during the sampling periods. Thus, the term "target ADC" refers to an ADC being subjected to a timing calibration process from among the ADCs 110, whereas the term "adjacent ADC" refers to another one of the ADCs 110 other than the target ADC.

Hereafter, for purposes of clarity, the written description will focus on timing calibration in relation to a singularly denominated target ADC. However, those skilled in the art will appreciate that various embodiments of the inventive concept may simultaneously perform (e.g., temporarily overlapping at least in part) a timing calibration operation for one or more of the ADCs 110.

As shown in FIG. 1, the timing calibration circuit 120 may include a calibration direction determination circuit 122. The calibration direction determination circuit 122 may be used to calculate a change in an absolute value of a difference between correlation values corresponding to the target ADC in order to determine a phase shift direction for a clock signal applied to the target ADC in response to the change in the absolute value. That is, the change in the absolute value may be understood as an index indicating whether (or not) the ongoing timing calibration is being correctly performed with respect to the target ADC. For example, when a change in the absolute value decreases during the timing calibration of the target ADC, the timing calibration is being correctly performed. However, when a change in the absolute value increases during the timing calibration of the target ADC, the timing calibration is being wrongly performed. In this case, it may be necessary to change the phase shift direction of a clock signal applied to the target ADC.

However, the foregoing is just example of an approach that may be taken in performing timing calibration of the target ADC, and the inventive concept is not limited thereto. For example, the correctness/wrongness of the timing calibration of the target ADC may be determined in relation to a number of different criteria related to change(s) in the absolute value of difference(s) between correlation values corresponding to the target ADC. Thereafter, the timing calibration circuit 120 may shift the phase of a clock signal applied to the target ADC in response to a phase shift direction determined by the calibration direction determination circuit 122.

The delay circuit 130 may provide the clock signals having different phases to the ADCs 110 (e.g., by variously delaying the phase of a reference clock signal received from the PLL circuit 10). In some embodiments, the delay circuit 130 may include a number of delay cells configured to delay the phase of a clock signal in response to a delay control signal received from the timing calibration circuit 120.

For example, the timing calibration circuit 120 may change the value of a delay control signal to shift the phase of a clock signal applied to the target ADC according to a determined phase shift direction. The resulting (changed) delay control signal may then be provided to the delay circuit 130. In some embodiments, a delay control signal may be a digital control signal having a defined number of bits. In this regard, the timing calibration circuit 120 may slightly change the value of the delay control signal when the determined phase shift direction is a first direction, but significantly change the value of the delay control signal when the determined phase shift direction is a second direction. Alternately, the timing calibration circuit 120 may significantly change the value of the delay control signal when the determined phase shift direction is the first direction, but slightly change the value of the delay control signal when the determined phase shift direction is the second direction.

Thus, the delay circuit 130 may selectively delay the phase of a clock signal applied to the target ADC in response to the phase shift direction using the delay control signal to define the delayed clock signal applied to the target ADC.

The analog-to-digital conversion circuit 100 may repeatedly perform the timing calibration operation in relation to the target ADC over a number of sampling periods, but terminate the timing calibration operation when the absolute value corresponding to the target ADC falls below a first threshold value.

In this regard, various embodiments of the timing calibration circuit 120 may be implemented in software and/or hardware.

Further of note, although FIG. 1 shows that the timing calibration circuit 120 including (or incorporating) the calibration direction determination circuit 122, this is just an example, and the inventive concept is not limited thereto.

From the foregoing, those skilled in the art will appreciate that the analog-to-digital conversion circuit 100 of FIG. 1 may be used to effectively correct a timing skew error by dynamically changing the phase shift direction of a clock signal in response to change in the absolute value of differences between correlation values in order to perform timing calibration for one or more of the ADCs 110. Accordingly, the analog-to-digital conversion circuit 100 may provide an analog-to-digital conversion operation with improved efficiency.

Figure 2:
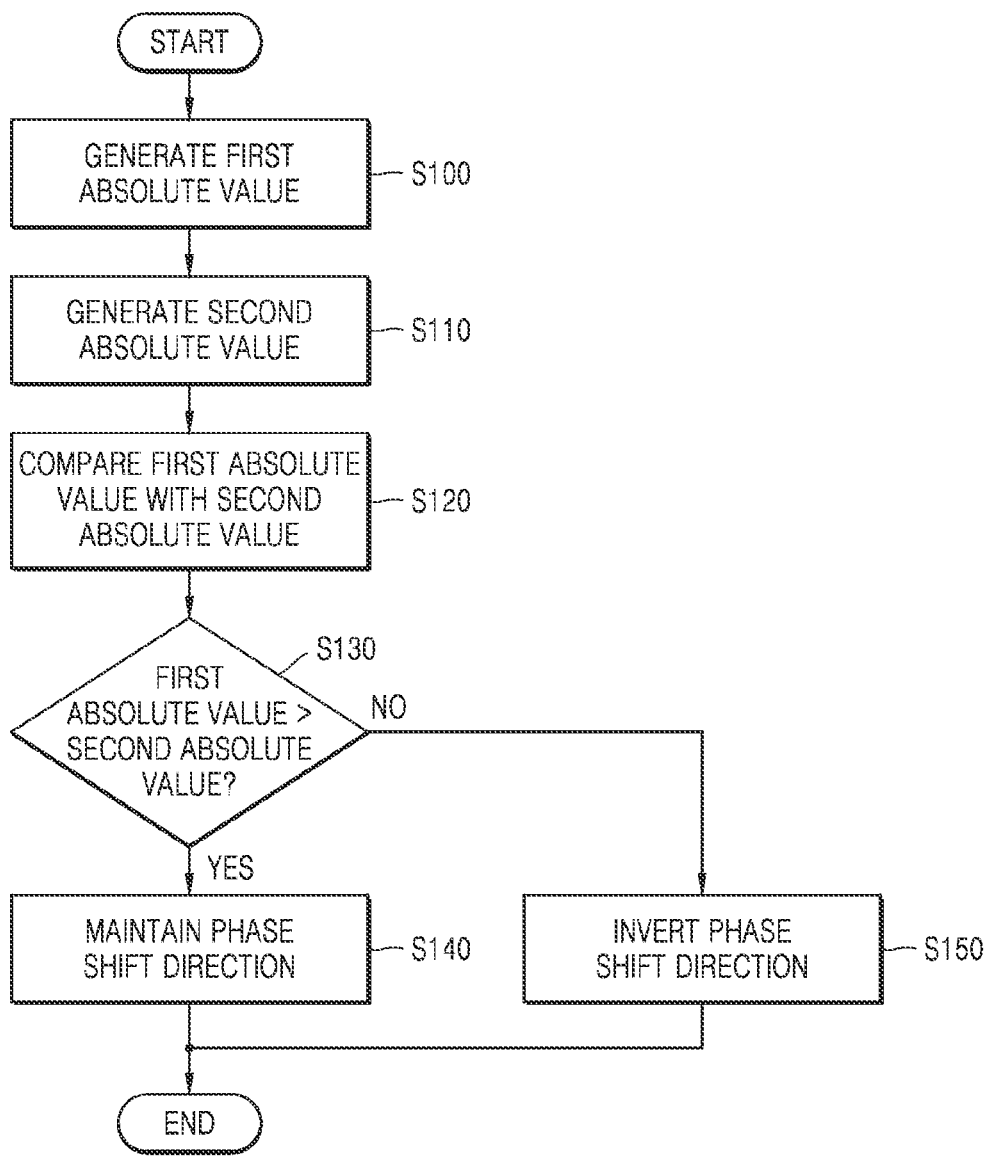
FIG. 2 is a flowchart illustrating in one example operation of the timing calibration circuit 120 of FIG. 1.

FIG. 2 is a flowchart illustrating operation of the timing calibration circuit 120 of FIG. 1 in one example according to embodiments of the inventive concept.

Referring to FIGS. 1 and 2, the timing calibration circuit 120 may generate a first absolute value corresponding to a first sampling period (S100). That is, the timing calibration circuit 120 may calculate correlation values in relation to (e.g.) first samples provided by a target ADC, second samples, third samples . . . , respectively output by various adjacent ADCs among the ADCs 110 during the first sampling period in order to generate a first absolute value related to differences between the correlation values.

The timing calibration circuit 120 may analogously generate (e.g., using a similar approach) a second absolute value corresponding to a second sampling period (S110).

The timing calibration circuit 120 may then compare the first absolute value and the second absolute value (S120).

Thereafter, if the timing calibration circuit 120 determines that the first absolute value is greater than the second absolute value (S130=YES)—thereby determining that the timing calibration operation for the target ADC is being correctly performed—the phase shift direction for the clock signal applied to the target ADC is maintained (S140).

Otherwise, if the timing calibration circuit 120 determines that the first absolute value is not greater than the second absolute value (S130=NO)—thereby determining that the timing calibration operation for the target ADC is being wrongly performed—the phase shift direction for the clock signal applied to the target ADC is inverted (or reversed) (S150).

Operation of the timing calibration circuit 120 may continue in this manner for a number of sampling periods by comparing the sequentially generated absolute value(s) until an absolute value falls below the first threshold value.

Figure 3:
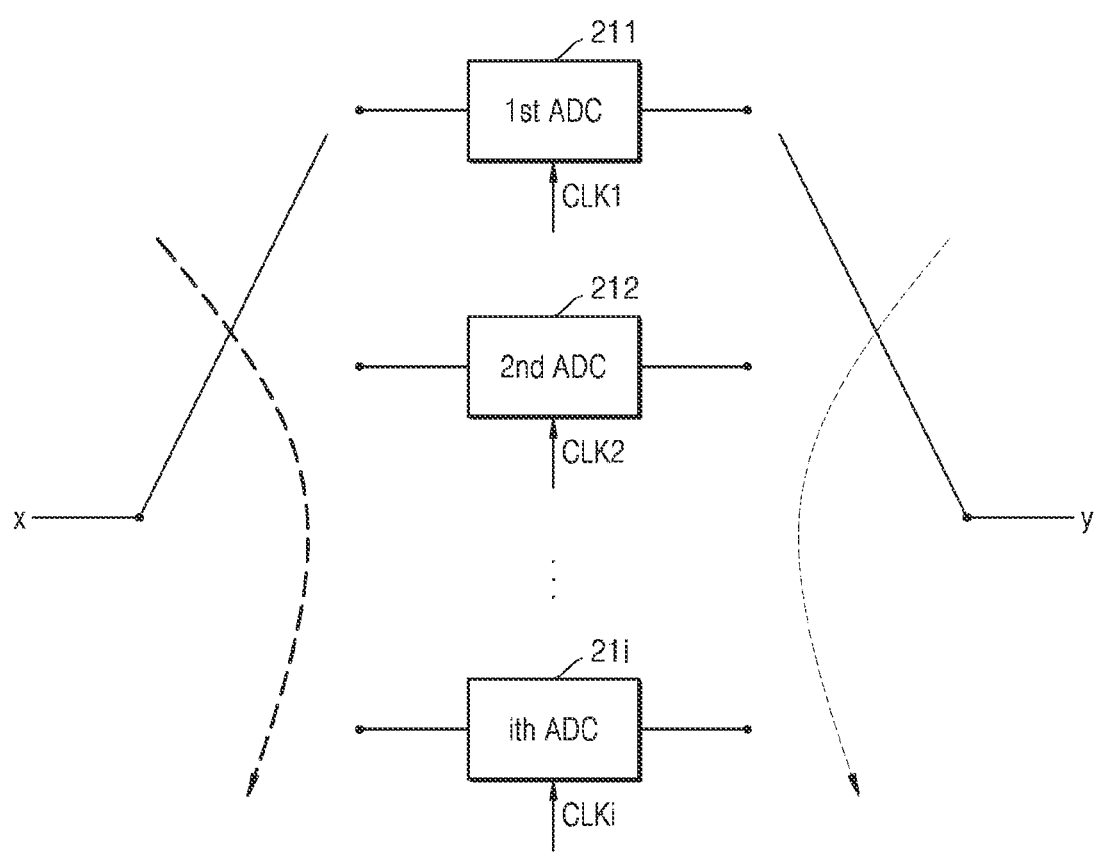
FIG. 3 is a conceptual diagram illustrating ADCs controlled using a time-interleaving approach according to embodiments of the inventive concept.

FIG. 3 is a conceptual diagram illustrating control of a number of ADCs (e.g., 211, 212 . . . 21i—hereafter "ADCs 211 to 21i") using a time-interleaving technique according to embodiments of the inventive concept.

Referring to FIG. 3, the ADCs 211 to 21i may generate a digital signal 'y' by alternately sampling an analog signal 'x' in response to clock signals (e.g., CLK1 to CLKi) having different phases.

Thus, the ADCs 211 to 21i may be sequentially selected, receive the analog signal x, sample the analog signal x at a rising/falling edge of each of the clock signals CLK1 to CLKi, and generate a sample, wherein samples collectively generated by some of the ADCs 211 to 21i—other than the target ADC—may constitute the digital signal y.

That is, two or more adjacent ADCs may be selected before or after the target ADC is selected. For example, the ADCs adjacent to a first ADC 211 may include a second ADC 212 and an i-th ADC 21i. Analogously, the ADCs adjacent to the second ADC 212 may include the first ADC 211 and the third ADC 213. Thus, in some embodiments, ADCs "adjacent to" a target ADC may be two or more ADCs most closely "physically adjacent to" the target ADC.

Figure 4:
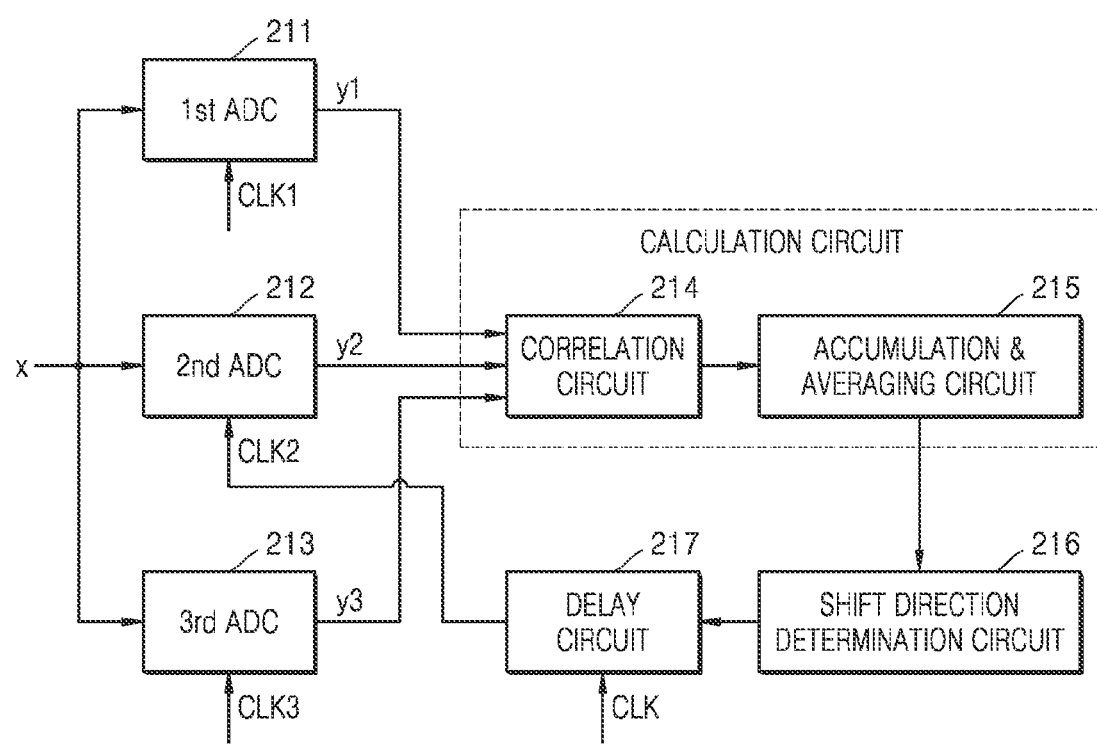
FIG. 4 is a block diagram illustrating an analog-to-digital conversion circuit according to embodiments of the inventive concept.

FIG. 4 is a block diagram of an analog-to-digital conversion circuit 200a according to embodiments of the inventive concept. Hereinafter, it is assumed for descriptive purposes that the target ADC is the second ADC 212 of FIG. 3.

Referring to FIGS. 1, 3 and 4, the analog-to-digital conversion circuit 200a is further assumed to include first ADC 211, second ADC 212 and third ADC 213 (hereafter collectively, "first to third ADCs 211, 212, and 213"), a correlation circuit 214, an accumulation & averaging circuit 215, a shift direction determination circuit 216, and a delay circuit 217.

During a first sampling period, the first to third ADCs 211, 212, and 213 may be alternately selected a number of times in order to generate first, second and third samples y1, y2, and y3 in response to first, second and third clock signals CLK1, CLK2, and CLK3 having different respective phases. In some embodiments, the numbers of first to third samples y1, y2, and y3 in one sampling period may vary. For example, the numbers of first to third samples y1, y2, and y3 may be changed according to a mode of operation for the analog-to-digital conversion circuit 200a, as described in some additional detail hereafter.

For example, the correlation circuit 214 may calculate first correlation values between first samples y1 and second samples y2 and second correlation values between the second samples y2 and third samples y3 and calculate differences between the first correlation values and the second correlation values.

The accumulation & averaging circuit 215 may be used to accumulate differences between first correlation values and second correlation values and generate a first average value derived by averaging the accumulated values. The correlation circuit 214 and the accumulation & averaging circuit 215 may be referred to as "calculation circuits."

Next, the first to third ADCs 211, 212, and 213 and the calculation circuits may generate a second average value in a second sampling period (e.g.) in a manner like that described above.

For example, the shift direction determination circuit 216 may compare a first absolute value corresponding to the absolute value of the first average value with a second absolute value corresponding to the absolute value of the second average value and determine a phase shift direction for a second clock signal CLK2 applied to the second ADC 212 in response to a result of the comparison. In some embodiments, the shift direction determination circuit 216 may store the first absolute value in a register (not shown) or a memory (not shown) and read out the first absolute value from the register or the memory when the shift direction determination circuit 216 compares the first absolute value with the second absolute value. The shift direction determination circuit 216 may store the shift direction determination circuit 216 in the register or the memory. For example, assuming that the phase of the second clock signal CLK2 is shifted in a negative direction, the shift direction determination circuit 216 may determine to shift the phase of the second clock signal CLK2 by maintaining the phase shift direction for the second clock signal CLK2 to the negative direction when the first absolute value is greater than the second absolute value and determine to shift the phase of the second clock signal CLK2 by inverting the phase shift direction for the second clock signal CLK2 to a positive direction when the second absolute value is greater than the first absolute value.

In some embodiments, the shift direction determination circuit 216 may change the value of a delay control signal in response to a determined phase shift direction and provide a changed delay control signal to the delay circuit 217.

In some embodiments, the delay circuit 217 may delay a reference clock signal CLK in response to a delay control signal and provide the second clock signal CLK2 having the phase shifted to a predetermined degree in the determined phase shift direction to the second ADC 212.

Figure 5A:
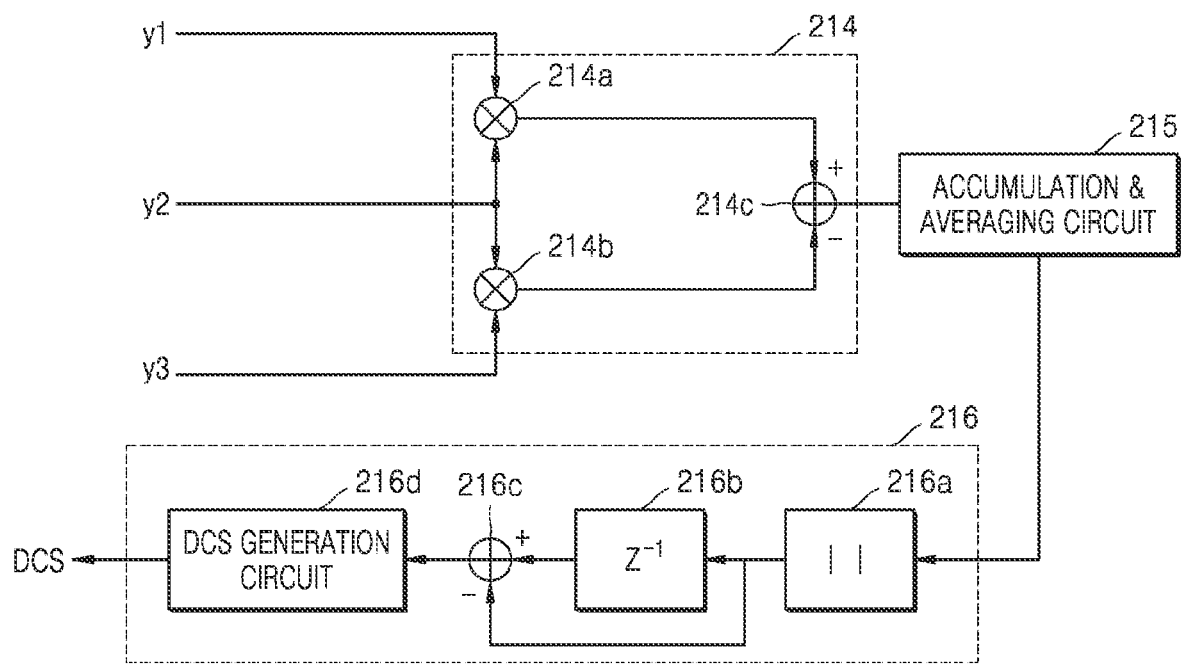
FIG. 5A is a block diagram further illustrating the analog-to-digital conversion circuit 200*a* of FIG. 4.
Figure 5B:
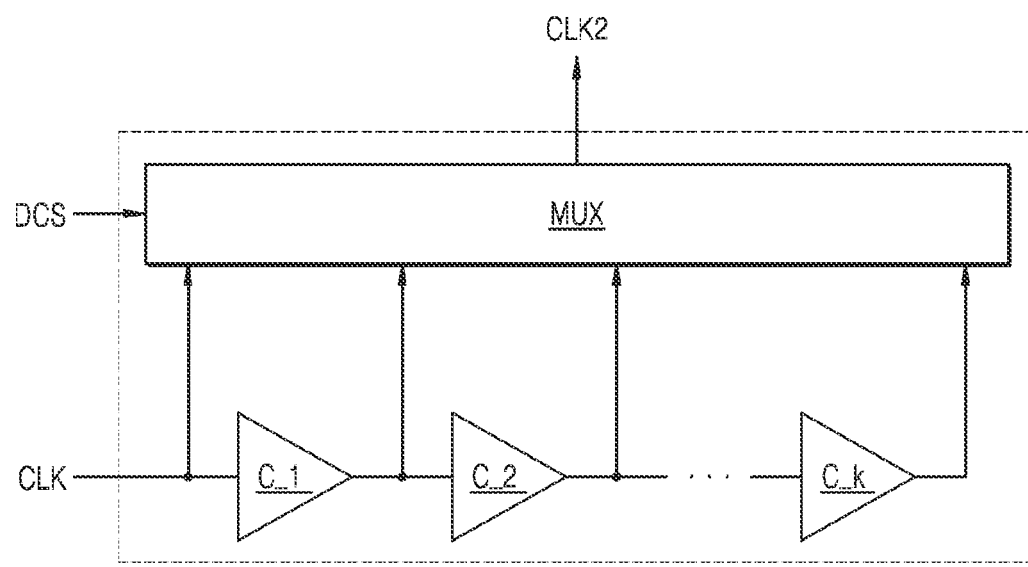
FIG. 5B is a block diagram further illustrating in one example the delay circuit 217 of FIG. 4.

FIG. 5A is a circuit diagram illustrating one possible configuration of the analog-to-digital conversion circuit 200a of FIG. 4, and FIG. 5B is a circuit diagram further illustrating in one example the delay circuit 217 of FIG. 4.

Referring to FIGS. 4 and 5A, the correlation circuit 214 may include a first correlator 214a, a second correlator 214b, and a subtractor 214c. The first correlator 214a may generate first correlation values by performing a correlation operation between the first samples y1 and the second samples y2, whereas the second correlator 214b may generate second correlation values by performing a correlation operation between the second samples y2 and the third samples y3. The subtractor 214c may provide differences between the first correlation values and the second correlation values to the accumulation & averaging circuit 215 through a subtraction operation.

In some embodiments, the accumulation & averaging circuit 215 may accumulate differences received from the correlation circuit 214, generate an average value by performing an averaging operation, and provide the average value to the shift direction determination circuit 216.

In some embodiments, the shift direction determination circuit 216 may include an absolute value generation circuit 216a, a register 216b, a subtractor 216c, and a delay control signal generation circuit 216d. The absolute value generation circuit 216a may generate the absolute value of an average value received from the accumulation & averaging circuit 215 and store the absolute value in the register 216b. The subtractor 216c may generate a signal indicating a difference between an absolute value previously stored in the register 216b and a currently generated absolute value through a subtraction operation and provide the signal to the delay control signal generation circuit 216d. The delay control signal generation circuit 216d may recognize a change in the absolute value in response to a signal received from the subtractor 216c and generate a delay control signal DCS in response to the change in the absolute value.

Referring to FIGS. 4 and 5B, the delay circuit 217 may include delay cells C_1 to C_k and a multiplexer MUX. The delay cells C_1 to C_k may each delay a phase by a predetermined unit, and the delay cells C_1 to C_k may each delay a clock signal CLK and output a delayed clock signal CLK2 to the multiplexer MUX. Hereinafter, a clock signal before passing through the delay calls C_1 to C-k may be referred to as a "reference clock signal." The multiplexer MUX may select any one of delayed clock signals or a non-delayed clock signal (or the reference clock signal) CLK from the delay cells C_1 to C_k in response to the delay control signal DCS and output the same as the second clock signal CLK2.

In some embodiments, the delay control signal DCS may include a number of bits corresponding to the number of delay cells C_1 to C_k. For example, when the number of delay cells C_1 to C_k is 15, the delay control signal DCS may include four (4) bits. Also, a delay unit of the delay cells C_1 to C_k may correspond to the minimum delay unit of the second clock signal CLK2.

FIGS. 6A, 6B, 7A, and 7B are respective timing diagrams further describing operation of a timing calibration circuit according to embodiments of the inventive concept. Hereinafter, first, second and third sampling periods are arranged in order, a first operation ① shows shifting of the phase of the second clock signal CLK2 in response to a result of comparing a first absolute value corresponding to a first sampling period with a second absolute value corresponding to a second sampling period, a second operation ② shows shifting of the phase of the second clock signal CLK2 in response to a result of comparing the second absolute value corresponding to the second sampling period with a third absolute value corresponding to a third sampling period, and a third operation ③ shows shifting of the phase of the second clock signal CLK2 in response to a result of comparing the third absolute value corresponding to the third sampling period with a fourth absolute value corresponding to a fourth sampling period.

Figure 6A:
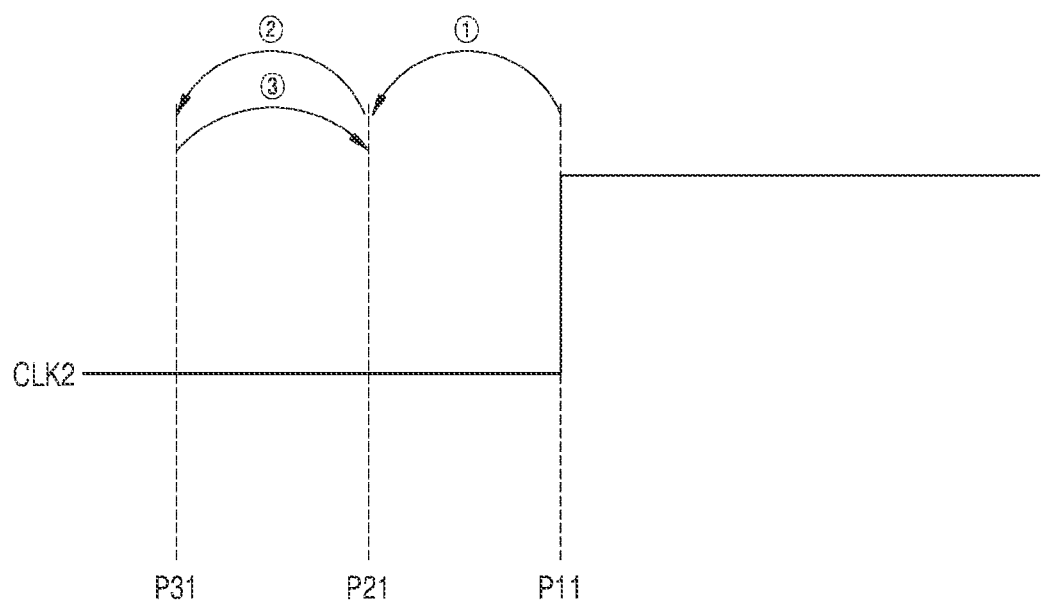
FIGS. 6A, 6B, 7A, and 7B are respective timing diagrams that collectively illustrate operation of a timing calibration circuit according embodiments of the inventive concept.

Referring to FIG. 6A, in the first operation ①, a timing calibration circuit may shift the phase of the second clock signal CLK2 from 'P11' to 'P21' in response to the first absolute value that is greater than the second absolute value. In the second operation ②, the timing calibration circuit may shift the phase of the second clock signal CLK2 from 'P21' to 'P31' in response to the second absolute value that is greater than the third absolute value. That is, in the first operation ① and the second operation ②, the timing calibration circuit may shift the phase of the second clock signal CLK2 in the same direction, that is, a first direction. In the third operation ③, the timing calibration circuit may shift the phase of the second clock signal CLK2 from 'P31' to 'P21' in response to the fourth absolute value that is greater than the third absolute value. That is, in the third operation ③, the timing calibration circuit may shift the phase of the second clock signal CLK2 in a second direction opposite to the first direction.

Also, in some embodiments, a first degree to which the phase of the second clock signal CLK2 is shifted in the first direction may be identical to a second degree to which the phase of the second clock signal CLK2 is shifted in the second direction. For example, the first degree and the second degree may each be an n multiple (here, 'n' is a positive integer) of the delay unit of the delay cells C_1 to C_k of FIG. 5.

Figure 6B:
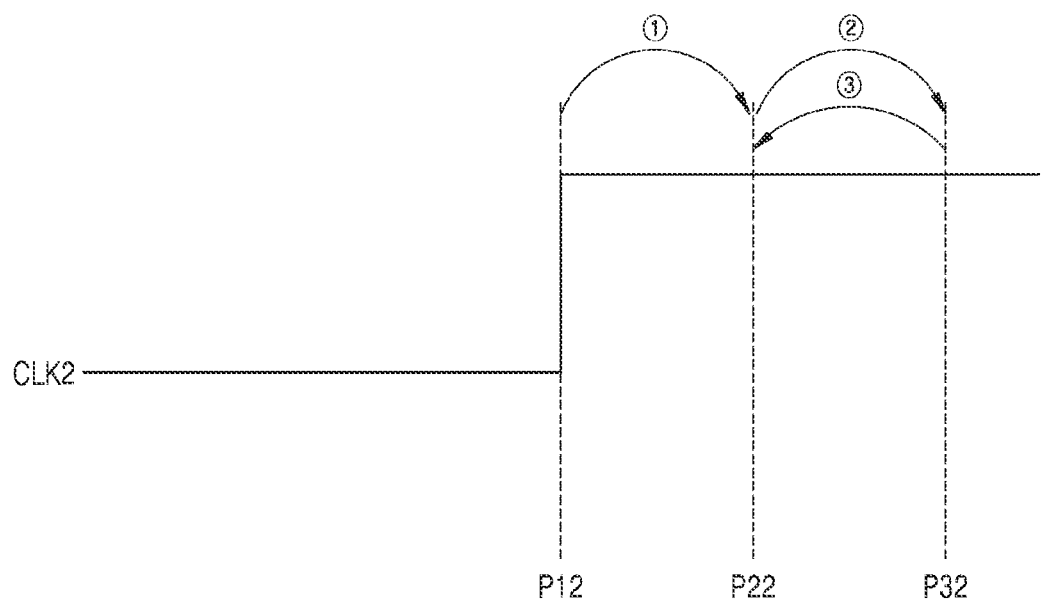

Referring to FIG. 6B, in the first operation ①, a timing calibration circuit may shift the phase of the second clock signal CLK2 from 'P12' to 'P22' in response to the first absolute value that is greater than the second absolute value. In the second operation ②, the timing calibration circuit may shift the phase of the second clock signal CLK2 from 'P22' to 'P32' in response to the second absolute value that is greater than the third absolute value. That is, in the first operation ① and the second operation ②, the timing calibration circuit may shift the phase of the second clock signal CLK2 in the same direction, that is, a third direction. In the third operation ③, the timing calibration circuit may shift the phase of the second clock signal CLK2 from 'P32' to 'P22' in response to the fourth absolute value that is greater than the third absolute value. That is, in the third operation ③, the timing calibration circuit may shift the phase of the second clock signal CLK2 in a fourth direction opposite to the third direction.

Figure 7A:
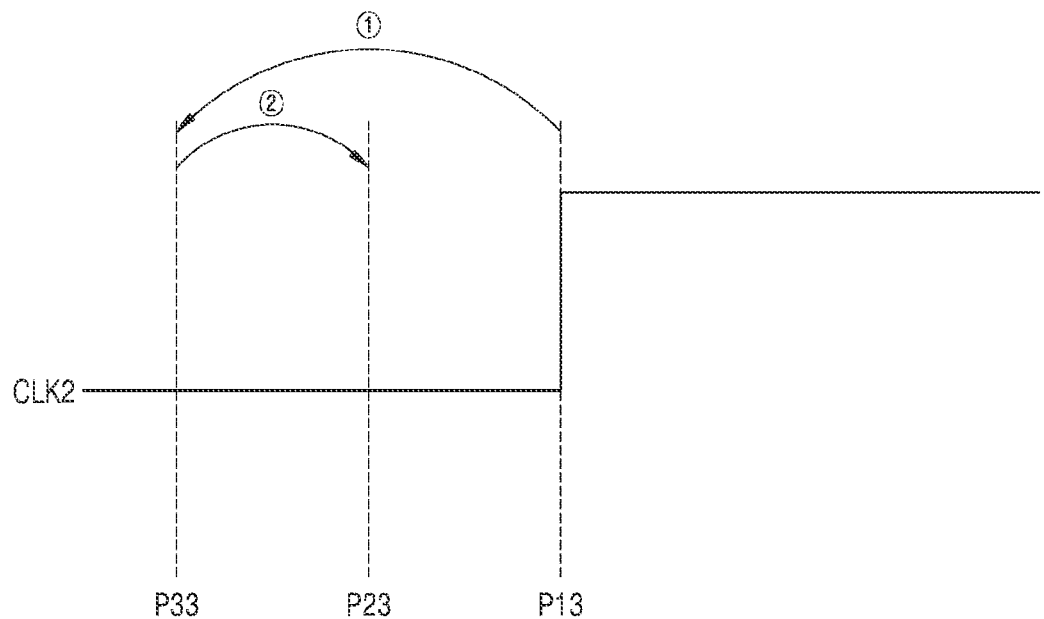

Referring to FIG. 7A, in the first operation ①, a timing calibration circuit may shift the phase of the second clock signal CLK2 from 'P13' to 'P33' in response to the first absolute value that is greater than the second absolute value. In the second operation ②, the timing calibration circuit may shift the phase of the second clock signal CLK2 from 'P33' to 'P23' in response to the third absolute value that is greater than the second absolute value. That is, the timing calibration circuit may shift the phase of the second clock signal CLK2 in the first direction in the first operation ① and shift the phase of the second clock signal CLK2 in the second direction opposite to the first direction in the second operation ②.

Also, in some embodiments, the first degree to which the phase of the second clock signal CLK2 is shifted in the first direction may be different from the second degree to which the phase of the second clock signal CLK2 is shifted in the second direction. For example, the first degree may be greater than the second degree.

Figure 7B:
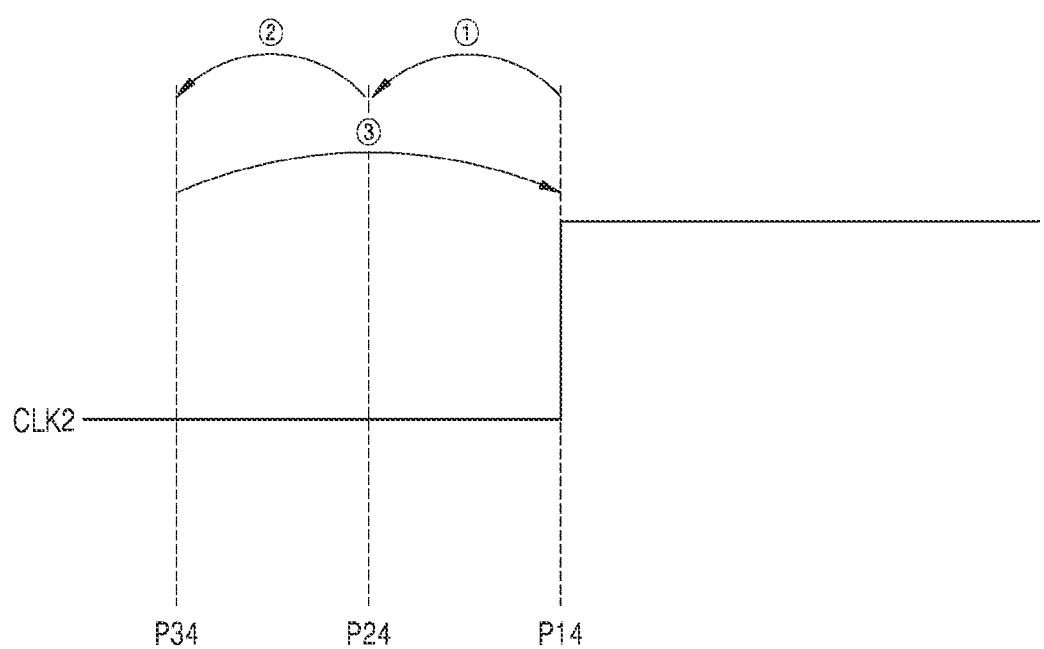

Referring to FIG. 7B, in the first operation ①, a timing calibration circuit may shift the phase of the second clock signal CLK2 from 'P14' to 'P24' in response to the first absolute value that is greater than the second absolute value. In the second operation ②, the timing calibration circuit may shift the phase of the second clock signal CLK2 from 'P24' to 'P34' in response to the second absolute value that is greater than the third absolute value. That is, in the first operation ① and the second operation ②, the timing calibration circuit may shift the phase of the second clock signal CLK2 in the same direction, that is, a first direction. In the third operation ③, the timing calibration circuit may shift the phase of the second clock signal CLK2 from 'P34' to 'P14' in response to the fourth absolute value that is greater than the third absolute value. That is, in the third operation ③, the timing calibration circuit may shift the phase of the second clock signal CLK2 in a second direction opposite to the first direction.

Also, in some embodiments, the first degree to which the phase of the second clock signal CLK2 is shifted in the first direction may be different from the second degree to which the phase of the second clock signal CLK2 is shifted in the second direction. For example, the second degree may be greater than the first degree.

In some embodiments, the timing calibration circuit may dynamically change the first degree and the second degree according to a mode of an analog-to-digital conversion circuit. Also, as described above, the timing calibration circuit may dynamically change the number of samples generated to obtain an absolute value according to a mode of the analog-to-digital conversion circuit. Detailed descriptions thereof are given later.

Figure 8:
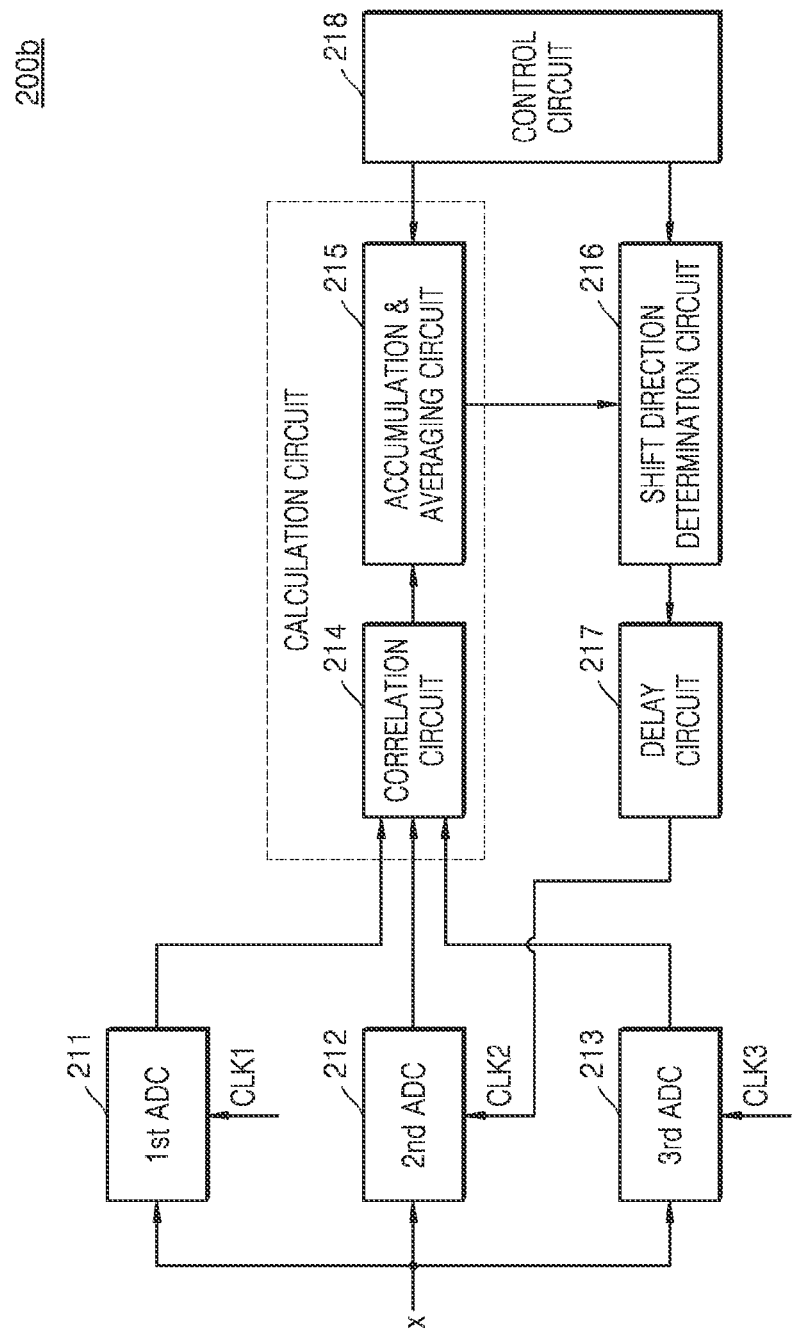
FIG. 8 is a block diagram of an analog-to-digital conversion circuit according to embodiments of the inventive concept.

FIG. 8 is a block diagram illustrating an analog-to-digital conversion circuit 200b according to embodiments of the inventive concept. Hereinafter, only material differences between the embodiment of FIGS. 4 and 8 will be emphasized.

Referring to FIG. 8, as compared to the analog-to-digital conversion circuit 200a of FIG. 4, the analog-to-digital conversion circuit 200b may further include a control circuit 218.

In some embodiments, the control circuit 218 may change at least one of the number of accumulated samples in the accumulation & averaging circuit 215 (or the number of samples generated by first to third ADCs 211 to 213 in one sampling period) and a phase shift degree of the shift direction determination circuit 216 regarding the second clock signal CLK2, in response to a mode of operation for the analog-to-digital conversion circuit 200b. The accumulated number (or the number of samples) may be referred to as a parameter related to timing calibration. In some embodiments, the control circuit 218 may change the accumulated number (or the number of samples) by adjusting the length of a sampling period.

In some embodiments, during a fast mode of operation for the analog-to-digital conversion circuit 200b in which data conversion speed is important, the control circuit 218 may change the number of accumulated samples in the accumulation & averaging circuit 215 (or the number of samples generated by the first to third ADCs 211 to 213 in one sampling period) to be less than a previous value, thereby performing timing calibration fast.

Alternately, during a slow mode of operation for the analog-to-digital conversion circuit 200b in which quality of a converted digital signal is important, the control circuit 218 may change the number of accumulated samples in the accumulation & averaging circuit 215 (or the number of samples generated by the first to third ADCs 211 to 213 in one sampling period) to be greater than a previous value, thereby performing timing calibration more accurately.

In some embodiments, the control circuit 218 may change a phase shift degree of the shift direction determination circuit 216 regarding the second clock signal CLK2 to be greater than a previous value when the analog-to-digital conversion circuit 200b operates in a coarse mode of operation relative to the timing calibration.

In some embodiments, the control circuit 218 may change a phase shift degree of the shift direction determination circuit 216 regarding the second clock signal CLK2 to be less than a previous value when the analog-to-digital conversion circuit 200b operates in a fine mode of operation relative to the timing calibration.

Also, in some embodiments, the control circuit 218 may change a phase shift degree of the shift direction determination circuit 216 regarding the second clock signal CLK2 in correspondence to the changed number of accumulated samples in the accumulation & averaging circuit 215 (or the number of samples generated by the first to third ADCs 211 to 213 in one sampling period). For example, because timing calibration may be performed in response to an absolute value with improved reliability when the changed accumulated number is greater than a previous value, the control circuit 218 may change the phase shift degree regarding the second clock signal CLK2 to be greater than a previous degree. In contrast, because timing calibration needs to be performed in response to an absolute value with slightly deteriorated reliability when the changed accumulated number is less than the previous value, the control circuit 218 may change the phase shift degree regarding the second clock signal CLK2 to be less than the previous degree. However, it is merely an example embodiment, and the inventive concept is not limited thereto. The control circuit 218 may change at least one parameter in correspondence to various modes of operation for the analog-to-digital conversion circuit 200b.

Figure 9:
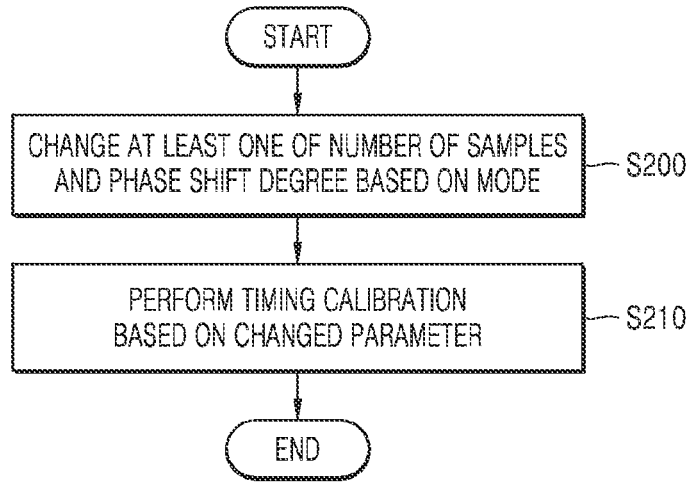
FIG. 9 is a flowchart illustrating a method of operating a timing calibration circuit according to embodiments of the inventive concept.

FIG. 9 is a flowchart illustrating a method of operating a timing calibration circuit according to embodiments of the inventive concept.

Referring to FIGS. 8 and 9, the timing calibration circuit may change at least one of a parameter related to the number of samples for generating correlation values in one sampling period and a parameter related to a phase shift degree regarding a clock signal applied to a target ADC, in response to a mode of operation for an analog-to-digital conversion circuit (S200).

Then, the timing calibration circuit may perform timing calibration in response to a changed parameter (S210).

Figure 10:
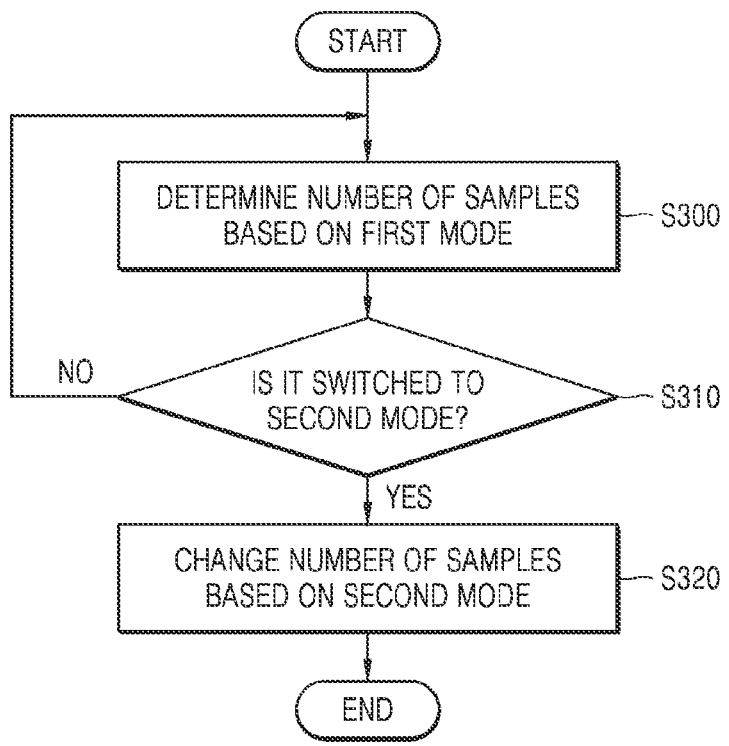
FIG. 10 is a flowchart illustrating an approach wherein a timing calibration circuit changes a number of samples according to embodiments of the inventive concept.

FIG. 10 is a flowchart illustrating operation of a timing calibration circuit that changes the number of samples according to embodiments of the inventive concept.

Referring to FIG. 10, the timing calibration circuit may determine the number of samples to be generated by ADCs to generate correlation values during one sampling period in response to a first mode of operation (hereafter for brevity, "mode") when an analog-to-digital conversion circuit operates in the first mode (S300). The timing calibration circuit may check whether the mode of the analog-to-digital conversion circuit is switched from the first mode to a second mode (S310). If the first mode is switch to the second mode (S310=YES), the timing calibration circuit may change the number of samples in response to the second mode of the analog-to-digital conversion circuit (S320). Otherwise, if the first mode is not switched to the second mode (S310=NO), the method returns to step S300.

Figure 11:
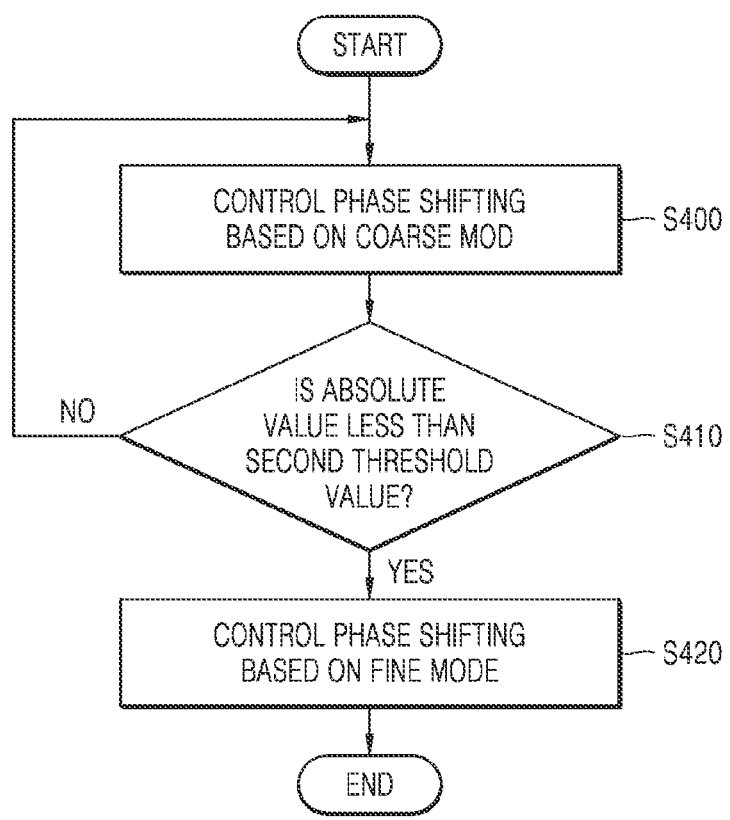
FIG. 11 is a flowchart illustrating an approach wherein a timing calibration circuit changes a phase shift degree according to embodiments of the inventive concept.

FIG. 11 is a flowchart illustrating operation of a timing calibration circuit that changes a phase shift degree according to embodiments of the inventive concept.

Referring to FIG. 11, the timing calibration circuit may control phase shifting for a clock signal applied to a target ADC in response to a coarse mode when the analog-to-digital conversion circuit operates in the coarse mode for timing calibration (S400). The timing calibration circuit may determine whether a currently generated absolute value is less than a second threshold value (S410). If the absolute value is less than the second threshold value (S410=YES), the analog-to-digital conversion circuit may operate in a fine mode in relation to timing calibration. That is, timing calibration circuit may control phase shifting for a clock signal applied to a target ADC in response to the fine mode. For example, the timing calibration circuit may control a phase shift degree of the clock signal in response to the fine mode to become less than that in the coarse mode. Otherwise, If the absolute value is not less than the second threshold value (S410=NO), the method returns to step S400.

Figure 12:
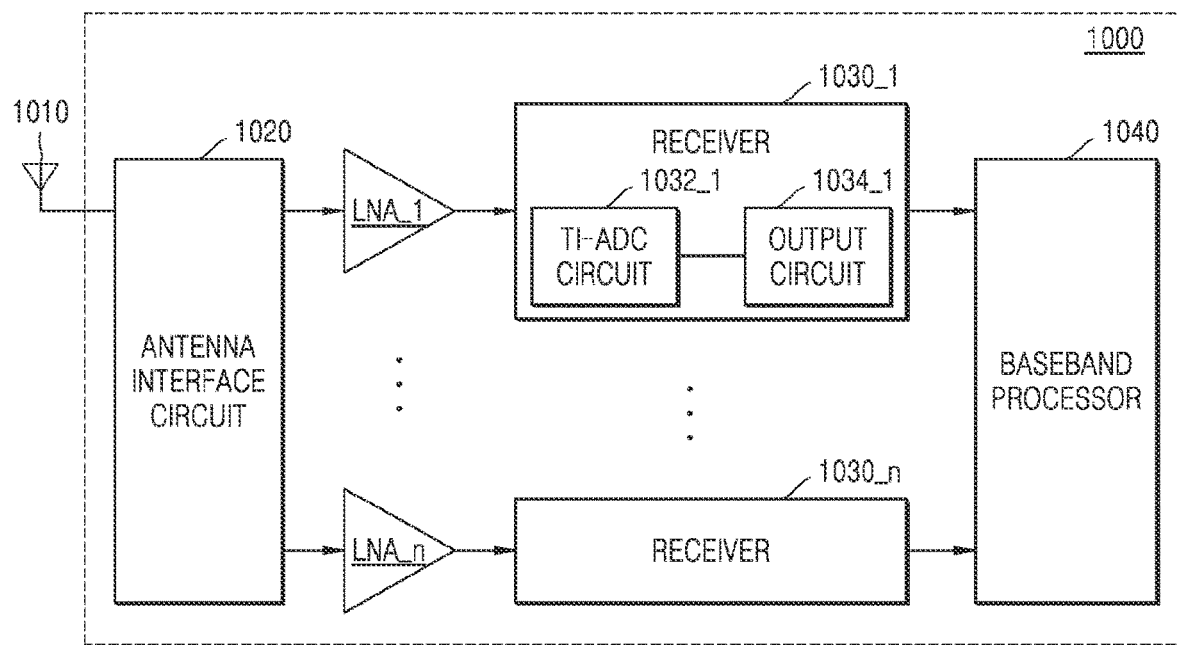
FIG. 12 is a block diagram illustrating a wireless communication device according to embodiments of the inventive concept.

FIG. 12 is a block diagram illustrating a wireless communication device 1000 according to embodiments of the inventive concept.

Referring to FIG. 12, the wireless communication device 1000 may include an antenna 1010, an antenna interface circuit 1020, low noise amplifiers (e.g., LNA_1 to LNA_n), receivers (e.g., 1030_1 to 1030_n), and a baseband processor 1040.

The antenna interface circuit 1020 may route an analog signal received through the antenna 1010 to one or more of the receivers 1030_1 to 1030_n. The antenna interface circuit 1020 may include switch elements, a duplexer, a filter circuit, an input matching circuit, etc.

The low noise amplifiers LNA_1 to LNA_n may perform low noise amplification on the received analog signal and output a result thereof to the receivers 1030_1 to 1030_n connected thereto.

The baseband processor 1040 may perform a processing operation including a modulation operation on digital signals transmitted from the receivers 1030_1 to 1030_n.

In some embodiments, the first receiver 1030_1 may include an analog-to-digital conversion circuit 1032_1 to which example embodiments of the inventive concept are applied and an output circuit 1034_1. The analog-to-digital conversion circuit 1032_1 may convert an analog signal received from a first low-noise amplifier LNA_1 to a digital signal and may perform a timing calibration operation to which the inventive concept is applied during a conversion operation. Also, the analog-to-digital conversion circuit 1032_1 may perform timing calibration as a background operation. Therefore, because a timing skew error is corrected in advance, the analog-to-digital conversion circuit 1032_1 may quickly provide a digital signal with improved quality to the baseband processor 1040 during an analog-to-digital conversion operation. In some embodiments, the first receiver 1030_1 may be implemented to further include the first low-noise amplifier LNA_1.

In some embodiments, the output circuit 1034_1 may perform an operation of improving quality of a digital signal provided by the analog-to-digital conversion circuit 1032_1. For example, the output circuit 1034_1 may equalize a digital signal in response to at least one of Continuous Time Linear Equalization (CTLE), Decision Feedback Equalization (DFE), and Feed-Forward Equalization (FFE).

The above-stated configuration of the first receiver 1030_1 may be applied to the other receivers 1030_2 to 1030_n.

Figure 13:
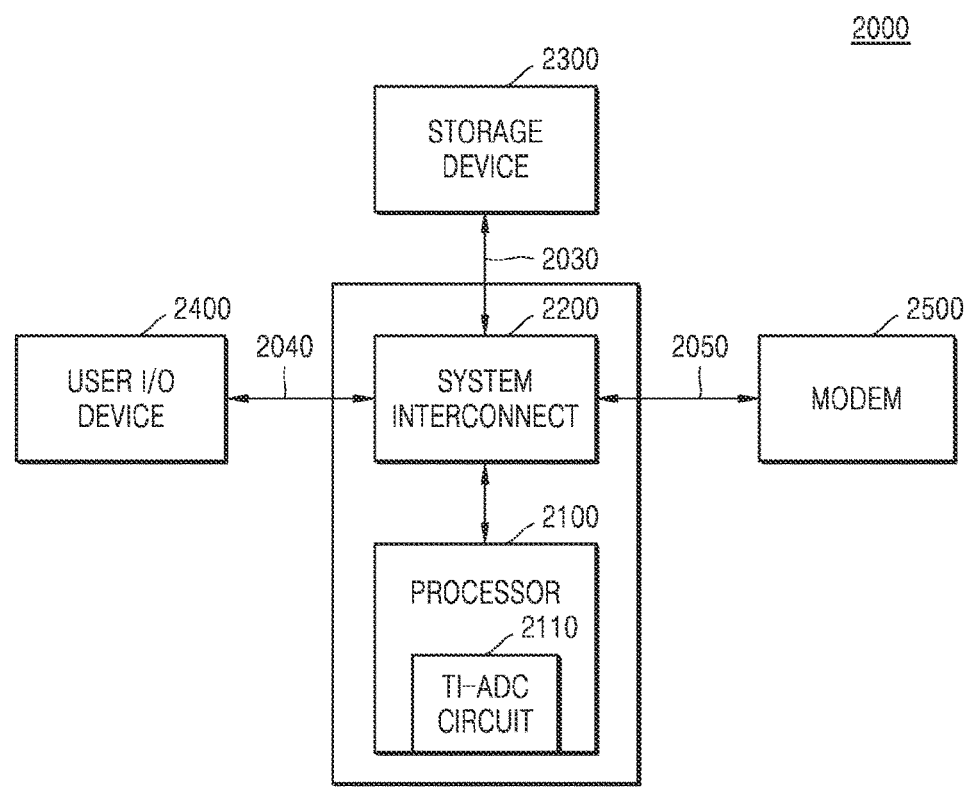
FIG. 13 is a block diagram illustrating a computing system according to embodiments of the inventive concept.

FIG. 13 is a block diagram illustrating a computing system 2000 according to embodiments of the inventive concept.

Referring to FIG. 13, the computing system 2000 may include a processor 2100, a system interconnect 2200, a storage device 2300, a user input/output (I/O) device 2400, and a modem 2500. In some embodiments, the processor 2100, the system interconnect 2200, the storage device 2300, the user I/O device 2400, and the modem 2500 may be mounted on a single substrate (not shown). The storage device 2300, the user I/O device 2400, and the modem 2500 may be connected to the system interconnect 2200 via channels 2030, 2040, and 2050, respectively. The channels 2030, 2040, and 2050 may each be in response to one of various standards like Peripheral Component Interconnect Express (PCIe), Nonvolatile Memory Express (NVME), Advanced Extensible Interface (AXI), and ARM Microcontroller Bus Architecture (AMBA).

The storage device 2300 may function as a memory of the computing system 2000. The storage device 2300 may store an operation system driven by the processor 2100, applications, and original copies of user data. The storage device 2300 may include a hard disk drive (HDD), a solid state drive (SSD), and an optical disk drive (ODD).

The user I/O device 2400 may be configured to exchange information with a user. The user input/output device 2400 may include a user input device for receiving information from a user (e.g., a keyboard, a mouse, a touch panel, an operation sensor, a microphone, etc.). The user I/O device 2400 may include a user output device for providing information to a user, e.g., a display device, a speaker, a beam projector, a printer, etc.

The modem 2500 may be configured to exchange data with an external device wirelessly or via a wire. In some embodiments, the modem 2500 may be integrated with the processor 2100.

The processor 2100 may include a central processing unit or an application processor that controls the computing system 2000 and performs various operations. The processor 2100 may include an analog-to-digital conversion circuit 2110 to which example embodiments of the inventive concept are applied. The analog-to-digital conversion circuit 2110 may convert analog signals received from the storage device 2300, the user I/O device 2400, and the modem 2500 through the system interconnect 2200 to digital signals and perform timing calibration to which the inventive concept is applied, during a conversion operation. Also, the analog-to-digital conversion circuit 2110 may perform timing calibration as a background operation. Therefore, because a timing skew error is corrected in advance, the analog-to-digital conversion circuit 2110 may quickly provide a digital signal with improved quality to the processor 2100 during an analog-to-digital conversion operation. In some embodiments, the analog-to-digital conversion circuit 2110 may be implemented to be embedded in the system interconnect 2200.

While the inventive concept has been particularly shown and described with reference to a number of illustrated embodiments, it will be understood that various changes in form and detail may be made therein without departing from the scope of the inventive concept, as defined by the following claims.

What is claimed is:

1. An analog-to-digital conversion circuit comprising:
a first analog-to-digital converter (ADC), a second ADC and a third ADC collectively configured to perform conversion operations according to a time-interleaving technique; and
a timing calibration circuit configured to
calculate correlation values and determine differences between the correlation values using first samples generated by the first ADC, second samples generated by the second ADC, and third samples generated by the third ADC during sampling periods,
control a phase of a clock signal applied to the second ADC in response to a change in absolute value related to the differences generated during the sampling periods, and
shift the phase of the clock signal in a first direction when the change in absolute value decreases, and shift the phase of the clock signal in a second direction opposite to the first direction when the change in absolute value increases.

2. The analog-to-digital conversion circuit of claim 1, wherein a first degree to which the phase of the clock signal is shifted in the first direction is the same as a second degree to which the phase of the clock signal is shifted in the second direction.

3. The analog-to-digital conversion circuit of claim 1, wherein a first degree to which the phase of the clock signal is shifted in the first direction is different than a second degree to which the phase of the clock signal is shifted in the second direction.

4. The analog-to-digital conversion circuit of claim 3, wherein the first degree is greater than the second degree.

5. The analog-to-digital conversion circuit of claim 1, wherein the timing calibration circuit is further configured to adjust at least one of a number of the first samples, a number of the second samples, and a number of the third samples during at least one of the sampling periods in response to a change in a mode of operation for the analog-to-digital conversion circuit.

6. The analog-to-digital conversion circuit of claim 1, wherein the timing calibration circuit is further configured to control the phase of the clock signal applied to the second ADC in response to a change in a mode of operation for the analog-to-digital conversion circuit.

7. The analog-to-digital conversion circuit of claim 1, wherein the timing calibration circuit is configured to
accumulate differences between first correlation values and second correlation values for each of the sampling periods, the first correlation values indicate correlation between the first samples and the second samples, and the second correlation values indicate correlation between the second samples and the third samples,
generate an average value by averaging accumulated differences, and
generate the absolute value from the average value.

8. The analog-to-digital conversion circuit of claim 1, further comprising:
a delay circuit receiving the clock signal and including delay cells,
wherein the timing calibration circuit is further configured to change a value of a delay control signal selecting the delay cells in response to the change in the absolute value in order to generate a changed delay control signal, and thereafter provide the changed delay control signal to the delay circuit.

9. The analog-to-digital conversion circuit of claim 8, wherein the timing calibration circuit is further configured to decrease the value of the delay control signal when the change in the absolute value decreases, and to increase the value of the delay control signal when the change in the absolute value increases, to provide the changed delay control signal.

10. The analog-to-digital conversion circuit of claim 1, wherein the timing calibration circuit is further configured to perform a timing calibration operation in relation to the first ADC, the second ADC and the third ADC during timing calibration of the second ADC.

11. A receiver comprising:
an analog-to-digital conversion circuit configured to receive an analog signal and convert the analog signal to a digital signal; and
an output circuit configured to improve quality of the digital signal,
wherein the analog-to-digital conversion circuit comprises
analog-to-digital converters (ADCs) collectively configured to perform conversion operations according to a time-interleaving technique, and
a timing calibration circuit configured to calculate correlation values and determine differences between the correlation values using samples generated by a target ADC among the ADCs and correlation values using samples generated by another ADC among the ADCs that is adjacent the target ADC, control a phase of a clock signal applied to the target ADC in response to a change in absolute value related to the differences generated during sampling periods, and perform the timing calibration by determining at least one of a number of samples to generate the correlation values and a phase shift degree for the clock signal in response to a mode of operation for the analog-to-digital conversion circuit.

12. The receiver of claim 11, wherein the another ADC is an ADC among the ADCs disposed immediately before the target ADC, or an ADC among the ADCs disposed immediately after the target ADC.

13. The receiver of claim 11, wherein the timing calibration circuit is further configured to determine a shift direction for the phase of the clock signal in response to the change in absolute value.

14. The receiver of claim 13, wherein the timing calibration circuit is further configured to control the phase of the clock signal according to a shift degree related to the shift direction.

15. The receiver of claim 11, wherein the output circuit is further configured to equalize the digital signal using at least one of Continuous Time Linear Equalization (CTLE), Decision Feedback Equalization (DFE) and Feed-Forward Equalization (FFE).

16. The receiver of claim 11, further comprising:
a phase locked loop (PLL) circuit configured to generate the clock signal; and
a delay circuit configured to delay the clock signal in response to a delay control signal,
wherein the timing calibration circuit is further configured to increase or decrease a value of the delay control signal in response to the change in the absolute value.

17. A timing calibration circuit calibrating respective timings for a first analog-to-digital converter (ADC), a second ADC and a third ADC using a time-interleaving technique, the timing calibration circuit comprising:

an operation circuit configured to calculate correlation values and differences between the correlation values using first samples generated by the first ADC, second samples generated by the second ADC, and third samples generated by the third ADC during sampling periods;

a determination circuit configured to determine a phase shift direction for a clock signal applied to the second ADC in response to a change in absolute value related to the differences and change a value of a delay control signal in response to the phase shift direction to generate a changed delay control signal; and a delay circuit configured to delay the clock signal in response to the changed delay control signal.

18. The timing calibration circuit of claim 17, wherein the determination circuit is further configured to change the value of the delay control signal to shift the phase of the clock signal in a first direction when the change in the absolute value decreases, and to change the value of the delay control signal to shift the phase of the clock signal in a second direction opposite to the first direction when the change in the absolute value increases.

* * * * *